United States Patent [19]

Ebihara

[11] 4,196,404
[45] Apr. 1, 1980

[54] CRYSTAL OSCILLATOR HAVING LOW POWER CONSUMPTION

[75] Inventor: Heihachiro Ebihara, Tokorozawa, Japan

[73] Assignee: Citizen Watch Co., Ltd., Tokyo, Japan

[21] Appl. No.: 938,487

[22] Filed: Aug. 31, 1978

[30] Foreign Application Priority Data

Sep. 8, 1977 [JP] Japan ............................ 52/108090

[51] Int. Cl.² .......................................... H03B 5/36
[52] U.S. Cl. ............................. 331/116 FE; 331/173
[58] Field of Search ............ 331/116 R, 116 FE, 173; 58/23 R, 23 A, 23 BA, 23 AC, 23 TF

[56] References Cited

U.S. PATENT DOCUMENTS

| 3,855,549 | 12/1974 | Huener et al. ............ 331/116 FE X |
| 4,039,973 | 8/1977 | Yamashiro .................... 331/116 FE |

*Primary Examiner*—Siegfried H. Grimm
*Attorney, Agent, or Firm*—Holman & Stern

[57] ABSTRACT

Control transistors connected to the amplifier portion of a quartz crystal oscillator circuit are periodically switched between conducting and non-conducting states so that the quartz crystal element is alternately driven and oscillating freely, the output signal from the circuit being gradually attenuated during free oscillation intervals but recovering original amplitude when drive is reapplied and remaining in fixed phase.

2 Claims, 5 Drawing Figures

U.S. Patent    Apr. 1, 1980    4,196,404
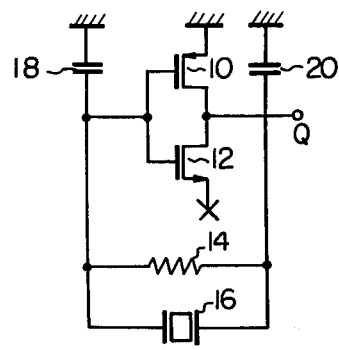
PRIOR ART Fig. 1
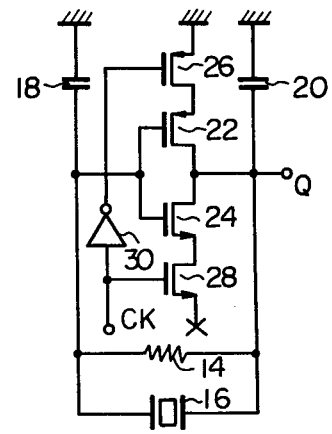
Fig. 2
Fig. 3
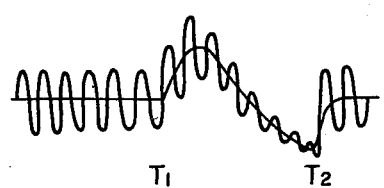
Fig. 4
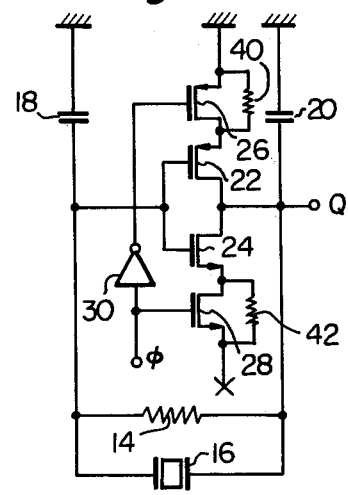
Fig. 5
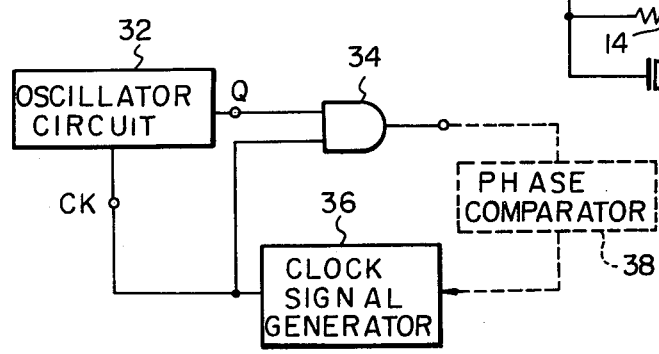

CRYSTAL OSCILLATOR HAVING LOW POWER CONSUMPTION

BACKGROUND OF THE INVENTION

This invention relates to oscillator circuits, and in particular to oscillator circuits used in portable electronic devices such as electronic timepieces.

The use of electronic devices of extremely small size incorporating quartz crystal oscillators has increased rapidly in recent years. Such devices include, for example, electronic timepieces such as electronic wristwatches. Due to the use of batteries of extremely small size in such devices, the total power consumption is required to be as low as possible, in order to ensure reasonable operating lifetime for the battery. In particular, the power consumption of the quartz crystal oscillator stage is often significant, due to the power required to drive the quartz crystal vibrator element. This is especially true when the oscillator frequency is relatively high, say of the order of several megahertz.

Various methods have been proposed hitherto for reducing the power consumed by such a quartz crystal oscillator stage. In one of these methods, the conductance of one or more transistors, used as amplifying elements to provide sustained oscillation, is reduced. This method effectively reduces the average current drawn by the oscillator circuit. However, the conductance of the metal oxide silicon field effect transistors normally used in such a circuit is sensitive to variations in ambient temperature and supply voltage. It is therefore possible that the oscillator may cease to operate at some level of ambient temperature or battery voltage, or may fail to start up again after oscillation is halted due to some temporary disturbance. It is therefore necessary to leave some margin of conductance in the transistors, over and above the minimum value required to provide sustained oscillation under standard operating conditions. Leaving such a margin of conductance, however, reduces the effectiveness of the method.

SUMMARY OF THE INVENTION

With an oscillator circuit in accordance with the present invention, the quartz crystal vibrator and associated circuit elements are driven in a periodic rather than a continuous manner. The amplitude of the output signal produced by the oscillator circuit will of course gradually decrease during the intervals when no drive is applied to the quartz crystal vibrator element, however it has been shown that this has no effect upon the precision of the oscillator output signal frequency, when this is averaged over a long period of time.

It is therefore an object of the present invention to provide an improved quartz crystal oscillator circuit having substantially lower power consumption than previous designs.

BRIEF DESCRIPTION OF THE DRAWINGS

A further understanding of this and other features, objects and advantages of the present invention will be apparent from the following description and the attached drawings, whose scope shall be provided by the appended claims.

In the accompanying drawings, in which:

FIG. 1 is a circuit diagram of a quartz crystal oscillator of conventional design;

FIG. 2 is a circuit diagram of a first embodiment of an oscillator circuit in accordance with the present invention;

FIG. 3 is a diagram illustrating the oscillator signal waveform of the circuit shown in FIG. 2;

FIG. 4 is a circuit diagram of a second embodiment of an oscillator circuit in accordance with the present invention;

FIG. 5 is a block diagram of a third embodiment of the present invention including means for generating a clock signal to control the oscillator drive conditions.

DETAILED DESCRIPTION OF A PREFERRED EMBODIMENT

Referring now to FIG. 1, the circuit diagram of a quartz crystal oscillator circuit of conventional design is shown therein. The amplifier portion of this circuit is composed of two metal oxide insulated gate silicon field effect transistors. These are a P-channel metal oxide silicon field effect transistor 10 (abbreviated hereinafter to P-MOS), and an N-channel metal oxide silicon field effect transistor 12 (abbreviated hereinafter to N-MOS). The source terminal of P-MOS 10 is connected to the high potential terminal of a power source (designated hereinafter as the H level), while the drain terminal of P-MOS 10 is connected to the drain terminal of N-MOS 12 and also to one terminal of a capacitor 20, to one terminal of a resistor 14 and to one terminal of a quartz crystal vibrator element 16. The source terminal of N-MOS 12 is connected to the low potential of the power source, (designated hereinafter as the L level). The gate terminals of P-MOS 10 and N-MOS 12 are connected together and to one terminal of a capacitor 18, to the other terminal of resistor 14, and to the other terminal of quartz crystal vibrator element 16. The other terminals of capacitors 18 and 20 are connected to the H level.

With the circuit arrangement shown in FIG. 1, it is possible to reduce the power consumption by reducing the conductance of either one or both of transistors 10 and 12. However, if the conductance is reduced excessively, then the oscillator may fail to operate at some extreme level of temperature, or when the voltage of the battery which serves as the power source falls below a certain level, or the oscillator may fail to start up again when halted due to a temporary disturbance.

FIG. 2 is a circuit diagram of a first embodiment of a quartz crystal oscillator circuit in accordance with the present invention. Circuit components having identical functions to those shown in FIG. 1 are indicated by the same numerals as are used in FIG. 1. Additional components used comprise a P-MOS transistor 26 an N-MOS transistor 28, and an inverter 30. The drain terminal of P-MOS transistor 26 is connected to the source terminal of P-MOS transistor 22, while the source terminal of P-MOS transistor 26 is connected to the H level. The gate terminal of P-MOS transistor 26 is connected to the output of inverter 30. The drain terminal of N-MOS transistor 28 is connected to the source terminal of N-MOS transistor 24, while the source terminal of N-MOS transistor 28 is connected to the L level. The gate terminal of N-MOS transistor 28 is connected to the input of inverter 30, and also to a terminal to which a clock signal CK is applied. The conductances of transistors 22, 24, 26 and 28 are selected such that stability of oscillation and start-up capability are ensured, while transistors 26 and 28 are in the conducting state.

When clock signal CK goes to the H level, then the gate potential of N-MOS transistor 28 goes to the H level, while the gate potential of P-MOS transistor 26 goes to the L level. Transistors 26 and 28 are therefore now in the conducting state. Quartz crystal vibrator element 16 is therefore driven into oscillation, so that an oscillation signal of fixed frequency appears at output terminal Q of the circuit. When clock signal CK goes to the L level, then the gate potential of N-MOS transistor 28 goes to the L level, while the gate potential of P-MOS transistor 26 goes to the H level. Transistors 26 and 28 therefore enter the non-conducting state. Since no current can now flow through transistors 22 and 24, no amplification takes place between the gate and drain terminals of these transistors. Quartz crystal vibrator element 16 is therefore left to oscillate substantially freely. As the energy stored in quartz crystal vibrator element 16 is dissipated due to mechanical and electrical losses, the amplitude of the oscillation signal appearing at terminal Q gradually becomes attenuated. Clock signal CK then returns to the H level, before the amplitude of the oscillation signal has fallen to zero. The amplitude of the oscillation signal appearing at terminal Q then rapidly increases to its original level, as the quartz crystal vibrator element 16 is again driven by transistors 22 and 24, without any substantial change in the phase of the oscillation signal. Thus, by periodically initiating and interrupting driving of quartz crystal vibrator element 16, continuous oscillator operation can be obtained.

During the intervals when quartz crystal vibrator element 16 is left to oscillate freely, the phase of the oscillation signal varies slightly. However, the output frequency is constant, if measured over a relatively long period of time. Such a signal is therefore suited for use as a standard timing signal for an electronic timepiece.

With the method of the present invention, sufficient conductance of the amplifier transistors is ensured when the amplifier is in the driven state, so that operation is unaffected by changes in ambient temperature and in battery voltage. In addition, virtually no power is drawn from the battery during the intervals of free oscillation of the quartz crystal vibrator element. With a conventional circuit, however, battery power must be supplied continuously. The average power consumption is determined by the duty cycle of clock signal CK, for an oscillator circuit in accordance with the present invention.

A series of experiments have been performed to determine the effects of variations in the characteristics of MOS transistors, variations in ambient temperature, etc., upon the operation of an oscillator circuit in accordance with the present invention. It has been found that satisfactory oscillation can be obtained with a level of power consumption which is much lower than that of a conventional oscillator circuit of this type.

FIG. 3 shows the waveform of the gate potential of P-MOS transistor 22 and N-MOS transistor 24. T1 indicates the point at which clock signal CK goes to the L level, while T2 indicates that time at which CK returns to the H level. It can be seen that there is a significant fluctuation of the bias level on the gate terminals of transistors 22 and 24 while clock signal CK is at the L level, due to the non-conducting condition of transistors 26 and 28 at this time. This bias level fluctuation can result in a variation of the phases of the oscillation signal, which increases in accordance with the duration of the intervals when clock signal CK is at the L level. This fact places a limitation upon the maximum duration of the periods when CK is at the L level, i.e. when the circuit is in a state of free oscillation.

A second embodiment of the present invention is shown in FIG. 4, whereby the above disadvantage of the embodiment shown in FIG. 2 is overcome. In FIG. 4, resistor 40 is connected between the drain and source terminals of P-MOS transistor 26, while resistor 42 is connected between drain and source of transistor 28. This ensures that the gate terminals of transistors 22 and 24 are biased to a fixed potential during the intervals when transistors 26 and 28 are in the non-conducting condition, i.e. during the intervals when clock signal CK is at the L level. This ensures increased stability of the oscillation frequency. Since resistors 28 and 30 do not play any part in oscillator drive operation, they can be of extremely high value, so that the current passed by these resistors can be made negligibly small. The oscillator output signal appearing at terminal Q in circuits of FIG. 2 and FIG. 4 may be used directly, or may be passed through a buffer stage such as a logic gate, before being utilized.

FIG. 5 shows a third embodiment of the present invention. Numeral 32 indicates a periodically driven oscillator circuit in accordance with the present invention, such as the arrangement shown in FIG. 2 or FIG. 4. Output terminal Q of oscillator circuit 32 is connected to one terminal of an AND gate 34. Clock signal CK is generated by a clock signal generator circuit 36, and is applied to oscillator circuit 32 to cause periodic oscillator drive, as described above. Clock pulse generator circuit 36 can be of various forms, such as an astable multivibrator, a ring oscillator, etc. The output from AND gate 34 consists of the oscillator output signal during the intervals in which the oscillator is in the driven state. If desired, this can be applied to a phase comparator circuit 38, and the output of this comparator used to control the operation of clock pulse generator circuit 36, so that a fixed phase relationship is established between clock signal CK and the frequency of oscillator circuit 32, i.e. a feedback control loop is formed. This is indicated by the broken lines in FIG. 5.

What is claimed is:
1. An oscillator circuit comprising:
   a quartz crystal vibrator element;
   a first P-MOS transistor having a drain terminal connected to a first terminal of said quartz crystal vibrator element and having a gate terminal connected to a second terminal of said quartz crystal vibrator element;
   a first N-MOS transistor having a drain terminal connected to said first terminal of said quartz crystal vibrator element and having a gate terminal connected to said second terminal of said quartz crystal vibrator element;
   a second P-MOS transistor having a drain terminal connected to a source terminal of said first P-MOS transistor and having a source terminal connected to a high potential of a power source;
   a second N-MOS transistor having a drain terminal connected to a source terminal of said first N-MOS transistor and having a source terminal connected to a low potential of said power source; and
   means for generating first and second control signals of mutually opposite phase and of mutually equal frequency of a predetermined periodic frequency lower than that of said quartz crystal vibrator element, said first control signal being applied to a gate terminal of said second P-MOS transistor and said second control signal being applied to a gate terminal of said second N-MOS transistor, said generating means for rendering said second P-MOS and said second N-MOS transistors in the same conductive/nonconductive state.

2. An oscillator circuit according to claim 1, and further comprising a first resistor connected between said drain and source terminals of said second P-MOS transistor and a second resistor connected between said drain and source terminals of said second N-MOS transistor.

* * * * *